(12) United States Patent
Sauer et al.

(10) Patent No.: US 10,540,036 B2
(45) Date of Patent: Jan. 21, 2020

(54) MULTIPLE CONTROLLERS FOR A CAPACITIVE SENSING DEVICE

(71) Applicant: Apple Inc., Cupertino, CA (US)

(72) Inventors: Christian M. Sauer, Cupertino, CA (US); Peter W. Richards, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 267 days.

(21) Appl. No.: 15/493,481

(22) Filed: Apr. 21, 2017

(65) Prior Publication Data

US 2017/0220193 A1 Aug. 3, 2017

Related U.S. Application Data

(63) Continuation of application No. 14/196,710, filed on Mar. 4, 2014, now Pat. No. 9,660,646.

(60) Provisional application No. 61/775,649, filed on Mar. 10, 2013.

(51) Int. Cl.
*G06F 3/041* (2006.01)
*G06F 3/044* (2006.01)
*H03K 17/96* (2006.01)
*G06F 3/0354* (2013.01)

(52) U.S. Cl.
CPC ............ *G06F 3/0416* (2013.01); *G06F 3/044* (2013.01); *G06F 3/0412* (2013.01); *G06F 3/0414* (2013.01); *H03K 17/9622* (2013.01); *G06F 3/03547* (2013.01); *G06F 2203/04107* (2013.01)

(58) Field of Classification Search
None
See application file for complete search history.

(56) References Cited

U.S. PATENT DOCUMENTS

| | | | |
|---|---|---|---|
| 7,262,609 B2 | 8/2007 | Reynolds | |
| 7,375,535 B1 | 5/2008 | Kutz et al. | |
| 8,144,126 B2* | 3/2012 | Wright | G06F 1/3203 345/173 |
| 8,502,576 B2 | 8/2013 | Hsieh | |
| 8,947,392 B2 | 2/2015 | Long | |
| 9,660,646 B1* | 5/2017 | Sauer | H03K 17/9622 |
| 2006/0284639 A1 | 12/2006 | Reynolds | |

(Continued)

OTHER PUBLICATIONS

Bau, et al., "TeslaTouch: Electrovibration for Touch Surfaces," UIST'10, Oct. 3-6, 2010, New York, New York USA, 10 pages.

(Continued)

*Primary Examiner* — Jermele M Hollington
(74) *Attorney, Agent, or Firm* — Brownstein Hyatt Farber Schreck, LLP

(57) ABSTRACT

A capacitive sensing device can include multiple capacitive sensors. A first device controller is operatively connected to a portion of the capacitive sensors, while a second device controller is operatively connected to another portion of capacitive sensors. A common node or shield can be connected between the first device controller and the second device controller. Charging and discharging events of selected drive lines in the capacitive sensing device and/or of the common node or shield can be synchronized to reduce undesirable effects such as noise and/or to prevent the charging events and the discharging events from overlapping with each other. One or more reference capacitive sensors can be shared by the multiple device controllers.

20 Claims, 9 Drawing Sheets

(56) References Cited

U.S. PATENT DOCUMENTS

| | | | |
|---|---|---|---|
| 2007/0176609 A1 | 8/2007 | Ely | |
| 2008/0061800 A1* | 3/2008 | Reynolds | G01R 27/2605 |
| | | | 324/678 |
| 2009/0045823 A1* | 2/2009 | Tasher | G06F 3/044 |
| | | | 324/686 |
| 2009/0046827 A1* | 2/2009 | Tasher | G01D 5/2405 |
| | | | 377/19 |
| 2009/0128511 A1* | 5/2009 | Sinclair | G06F 3/0202 |
| | | | 345/174 |
| 2009/0229892 A1 | 9/2009 | Fisher | |
| 2011/0007019 A1* | 1/2011 | Tasher | G06F 3/0416 |
| | | | 345/174 |
| 2011/0181543 A1 | 7/2011 | Long | |
| 2011/0221452 A1* | 9/2011 | Shyue | H03K 17/962 |
| | | | 324/658 |
| 2012/0286800 A1* | 11/2012 | Maharyta | G06F 3/0416 |
| | | | 324/603 |
| 2013/0169340 A1 | 7/2013 | Tao et al. | |
| 2015/0042615 A1 | 2/2015 | Yilmaz | |
| 2015/0233995 A1 | 8/2015 | Pratap | |
| 2015/0346907 A1* | 12/2015 | Nakajima | G06F 3/044 |
| | | | 345/174 |
| 2016/0179285 A1 | 6/2016 | Lee | |

OTHER PUBLICATIONS

Feist, "Samsung snags patent for new pressure sensitive touchscreens," posted on AndroidAuthority.com at URL: http://www.androidauthority.com/samsung-patent-pressure-sensitive-touchscreens-354860, Mar. 7, 2014, 1 page.

* cited by examiner

MULTIPLE CONTROLLERS FOR A CAPACITIVE SENSING DEVICE

CROSS-REFERENCE TO RELATED APPLICATIONS

This application is a continuation of U.S. patent application Ser. No. 14/196,710, filed on Mar. 4, 2014, now U.S. Pat. No. 9,660,646, which claims the benefit of U.S. Provisional Application No. 61/775,649, filed on Mar. 10, 2013, both of which are incorporated herein by reference in their entirety.

TECHNICAL FIELD

The present invention relates generally to display screens, and more specifically to touch or force sensing through capacitive sensing elements.

BACKGROUND

Touch sensitive devices have become increasingly popular in electronic devices due to their ease of use, their versatility of operation, and their ability to be integrated into an electronic device. Computer monitors, laptop and notebook computers, smart telephones, tablet computers, and portable media players are equipped with touch sensitive devices that are configured to sense touch as a user input. The touch may be sensed in accordance with one of several different touch sensing techniques, including, but not limited to, capacitive touch sensing.

In some instances, a touch sensing device can detect touch with a capacitive sensing device. A capacitive sensing device can be small, for example, when included in a track pad. In a touchscreen, the capacitive sensing device can be larger. Typically, a device controller or integrated circuit is connected to a capacitive sensing device to control the operations of the capacitive sensing device. Users expect a larger touch sensitive device to be as sensitive to touch as a smaller touch sensitive device. However, it can be challenging to control a large capacitive sensing device with one device controller. This can be due, in part, to the finite number of connections the device controller has to connect to the various signal lines used to control or operate the capacitive sensors of the touch sensitive device. For example, in some embodiments, each capacitive sensor in a capacitive sensing device can be formed at the intersection of a drive line and a separate sense line. The drive and sense lines are connected to the device controller, thus requiring multiple connections. Further, a shield in the capacitive sensing device may need to have a signal repeatedly applied to it during scanning operations. The signal applied to the shield can be produced by the device controller. Likewise, other components in the capacitive sensing elements may require control signals to operate, and these control signals may be generated by the device controller.

SUMMARY

In one aspect, one device controller can be operatively connected to a portion of the capacitive sensors in a capacitive sensing device, and another device controller can be operatively connected to another portion of the capacitive sensors in the capacitive sensing device. The capacitive sensors can be disposed, for example, in individual pixels or with intersecting drive and signal lines. The device controllers can each include a switching device, and the switching devices can be operatively connected to a common node or a shield. Charging and discharging of the drive lines and sense lines in the capacitive sensing device can be controlled by the first device controller and the second device controller. Charging and discharging of the common node or shield can be controlled by the device controllers through the switching devices. In some embodiments, the charging and discharging of a common node or shield can be synchronized to reduce or eliminate undesirable effects, such as cross-coupling noise. By way of example only, signals having three phases, an on phase, a tri-state phase, and an off phase can be applied to the common node or shield to prevent the charging events and the discharging events from overlapping with each other.

In another aspect, the switching devices can each include a first switch and a second switch connected to a switch node. A first current supply can be connected between a power supply and the first switch. A second current supply may be connected between the second switch and a reference signal level. In some embodiments, the reference signal level is ground. The common node can be operatively connected to the switch node in one switching device and to the switch node is the other switching device.

In another aspect, one or more reference capacitive sensors can be operatively connected to the first and second device controllers and shared by the first and second device controllers. At least one of the shared reference capacitive sensors can provide a reference capacitance that can be compared to the measured capacitances to determine if any changes in capacitance have occurred. The shared reference capacitive sensor or sensors can be disposed within the capacitive sensors in the capacitive sensing device and/or outside of the capacitive sensors.

In another aspect, a surface of a touch device can be partitioned into two or more sections with at least one section being scanned for capacitive changes in the capacitive sensors included in the at least one section. By way of example only, a touchscreen can be logically partitioned into two or more sections, and one section can be used to display an image while one or more additional sections can be used to interact with the image. The section or sections that are used to interact with the image can use an applied force to interact with the image. The capacitive sensors in the section or sections that is used to interact with the image can be operatively connected to one device controller. If so, the one device controller can be used to control a scanning operation. However, some of the capacitive sensors in the section or sections can be operatively connected to a first device controller and other capacitive sensors in the section or sections can be operatively connected to a second device controller. If so, both the first and second device controllers can be used to control the scanning operation. The charging and discharging of a common node or shield during the scanning operation can be synchronized to reduce or eliminate any undesirable effects.

And in yet another aspect, an electronic device can include a capacitive sensing device, a first device controller operatively connected to a portion of the capacitive sensors in the capacitive sensing device, and a second device controller operatively connected to another portion of the capacitive sensors in the capacitive sensing device. Both the first and second device controllers can each include a switching device. Each switching device may include a first switch and a second switch connected to a switch node. A first current supply can be connected between a power supply and the first switch. A second current supply may be connected between the second switch and a reference signal level. In some embodiments, the reference signal level is ground. The common node can be operatively connected to the switch node in one switching device and to the switch node is the other switching device. The electronic device may be an output device such as a display, or an input device such as a track pad or home button.

BRIEF DESCRIPTION OF THE DRAWINGS

Embodiments are better understood with reference to the following drawings. The elements of the drawings are not necessarily to scale relative to each other. Identical reference numerals have been used, where possible, to designate identical features that are common to the figures.

DETAILED DESCRIPTION

Figure 1A:
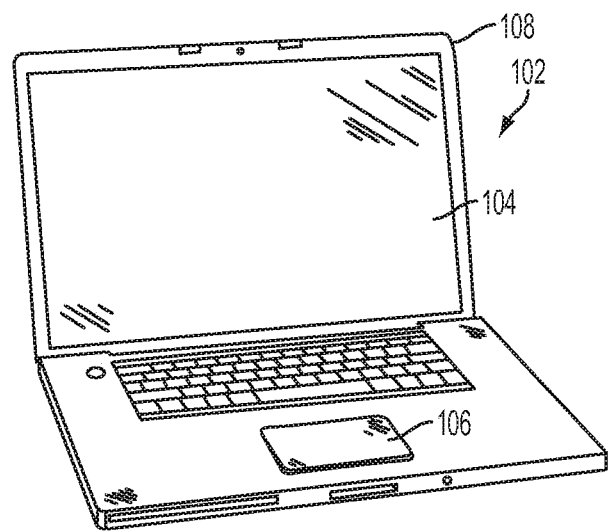
FIGS. 1A-1C depict front perspective views of examples of electronic devices that include capacitive sensing systems.

In some embodiments described herein, a capacitive sensing system includes a capacitive sensing device and multiple device controllers. The multiple device controllers can allow the capacitive sensing system to have scalability. For example, when the capacitive sensing device is smaller, one device controller can be used to control and operate the capacitive sensing device. Alternatively, when the capacitive sensing device is larger, multiple device controllers can be used to control and operate the capacitive sensing device. For example, in one embodiment, one device controller can drive the drive and sense lines for all of the capacitive sensors in a smaller capacitive sensing device while multiple device controllers can drive the drive and sense lines in a larger capacitive sensing device.

The surface of a touch device can be logically partitioned into two or more sections, and the capacitive sensors in at least one section can be used to detect an applied force. For example, a touchscreen can be used to display a visual image, such as, for example, a user interface, a program, or a settings screen. In one embodiment, the screen can be logically divided into one or more sections and one or more sections can be used to detect a force applied to the screen while other sections of the screen can be used for visual display only (i.e., not used for force detection). A number of folders can be displayed on the screen, for example, and an applied force can be used to interact with only one of the folders. Another example can include a program, such as a video game, that uses one or more sections of the screen for controlling or interacting with the video game using one or more applied forces.

In one embodiment, when a common node in the capacitive sensing system is to be charged and discharged concurrently with the drive and sense lines during a scanning operation, one device controller can charge and discharge the common node in a smaller system while the multiple device controllers can each charge and discharge the common node in a larger system. When multiple device controllers are used to control a scanning operation, the charging and discharging cycles of both the drive lines and the common node can be synchronized to reduce noise caused in part by stray capacitances. By way of example only, an intermediate state can be included in the signals output from the multiple controllers to prevent the charging and discharging events from overlapping.

Typically, the measured capacitances are compared to a reference or absolute capacitance when determining whether a force has been applied to a touch device. When multiple device controllers are used to sense capacitance changes, the reference capacitive sensor can be shared by the multiple device controllers. The shared reference capacitive sensor can be a discrete capacitive sensor separate from the capacitive sensing device, or the shared reference capacitive sensor can be included in the capacitive sensing device. Additionally, more than one reference capacitive sensor can be used.

Directional terminology, such as "top", "bottom", "front", "back", "leading", "trailing", etc., is used with reference to the orientation of the Figure(s) being described. Because components of embodiments described herein can be positioned in a number of different orientations, the directional terminology is used for purposes of illustration only and is in no way limiting.

Figure 1B:
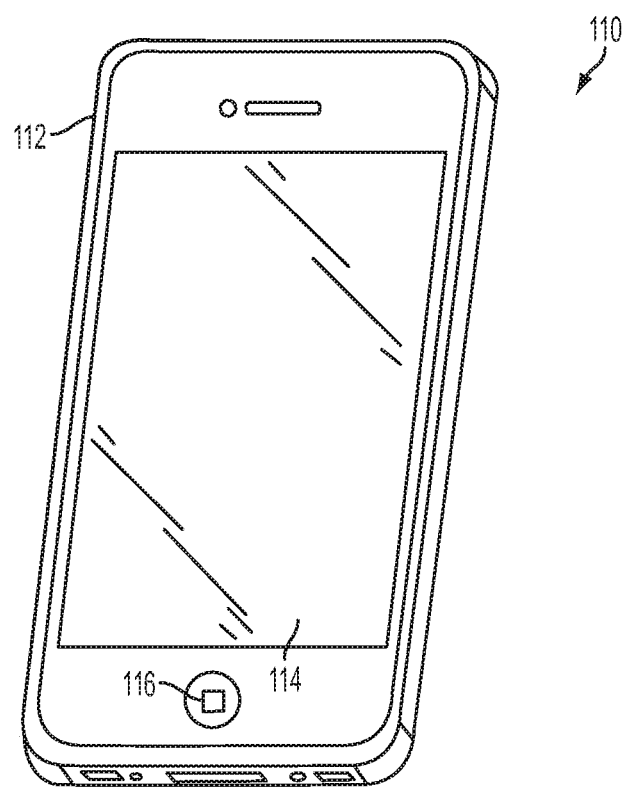
Figure 1C:
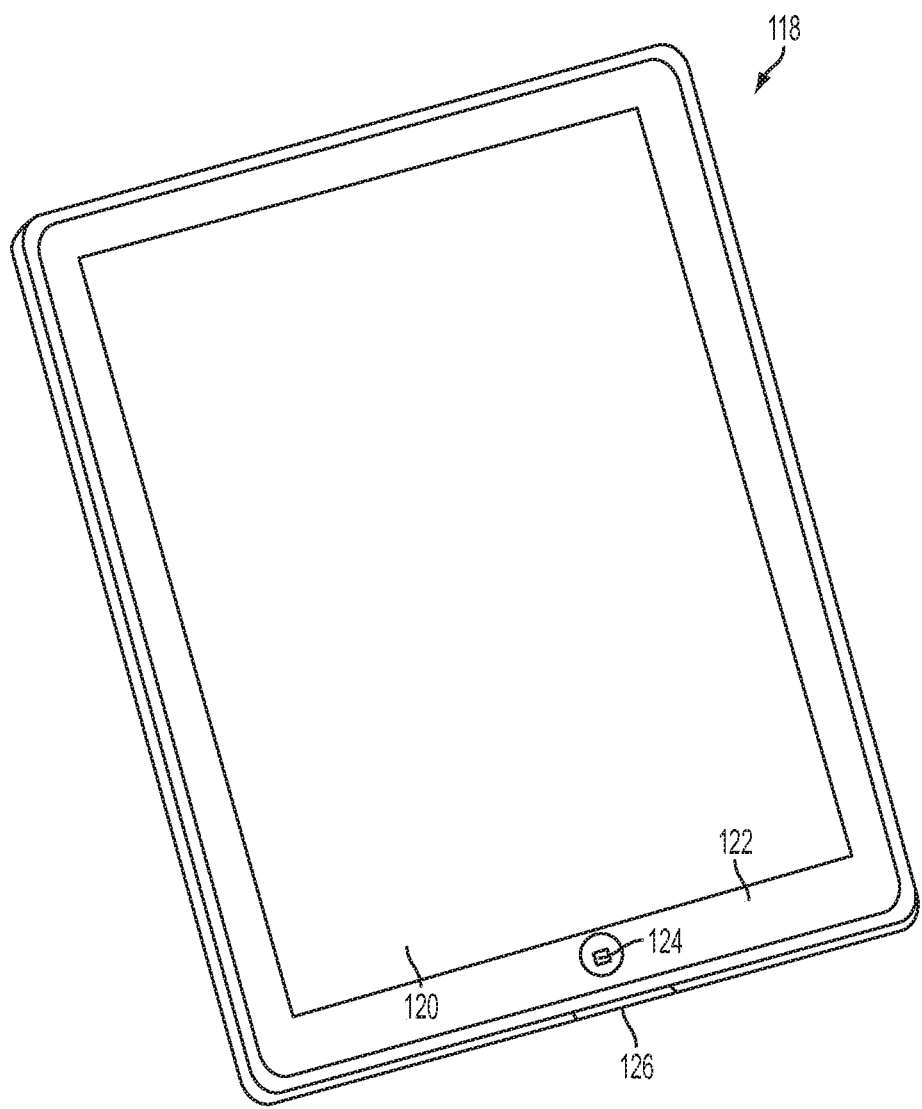

Referring now to FIGS. 1A-1C, there are shown front perspective views of examples of electronic devices that can include capacitive sensing systems. As shown in FIG. 1A, the electronic device 102 can be a laptop or netbook computer that includes a display 104 and a touch device 106, shown in the illustrated embodiment as a track pad. An enclosure 108 can form an outer surface or partial outer surface and protective case for the internal components of the electronic device 102, and may at least partially surround the display 104 and the track pad 106. The enclosure 108 can be formed of one or more components operably connected together, such as a front piece and a back piece.

The display 104 is configured to display a visual output for the electronic device 102. The display 104 can be implemented with any suitable display technology, including, but not limited to, a liquid crystal display (LCD), an organic light-emitting display (MED), or organic electroluminescence (OEL) display. The display 104 can include a multi-touch capacitive sensing touchscreen in some embodiments. The display 104 can include at least one capacitive sensing system that detects touch or force using capacitive changes at capacitive sensors.

The track pad 106 can be used to interact with one or more viewable objects on the display 104. For example, the track pad 106 can be used to move a cursor or to select a file or program (represented by an icon) shown on the display. The track pad 106 can use capacitive sensing to detect an object, such as a finger or a conductive stylus, near or on the surface of the track pad 106. The track pad 106 can include a capacitive sensing system that detects touch through capacitive changes at capacitive sensors. Additionally or alternatively, the same or another capacitive sensing system can be used to detect an amount of force applied to the track pad using capacitive changes.

FIG. 1B is a front perspective view of another electronic device that can include a capacitive sensing system. In the illustrated embodiment, the electronic device 110 is a smart telephone that includes an enclosure 112 surrounding a display 114 and one or more buttons 116 or input devices. The enclosure 112 can be similar to the enclosure described in conjunction with FIG. 1A, but may vary in form factor and function.

The display 114 can be implemented with any suitable display, including, but not limited to, a multi-touch capacitive sensing touchscreen (i.e., a touch device) that uses liquid crystal display (LCD) technology, organic light-emitting display (OLED) technology, or organic electro luminescence (OEL) technology. A capacitive sensing touchscreen device can detect a touch or force using capacitive changes at capacitive sensors.

The button 116 can take the form of a home button, which may be a mechanical button, a soft button (e.g., a button that does not physically move but still accepts inputs), an icon or image on a display, and so on. Further, in some embodiments, the button 116 can be integrated as part of a cover glass of the electronic device.

Referring now to FIG. 1C, there is shown a front perspective view of another electronic device that can include a capacitive sensing system. In the illustrated embodiment, the electronic device 118 is a tablet computer that can include a display 120, an enclosure 122, and one or more buttons 124 or input devices. The enclosure, display, and the one or more buttons can be similar to the enclosure, display, and button described in conjunction with FIG. 1B, but may vary in form factor and function.

The electronic device 118 can also include one or more receiving ports 126. A receiving port 126 can receive one or more plugs or connectors, including, but not limited to, a universal serial bus cable, a tip ring sleeve connector, or the like.

Figure 2:
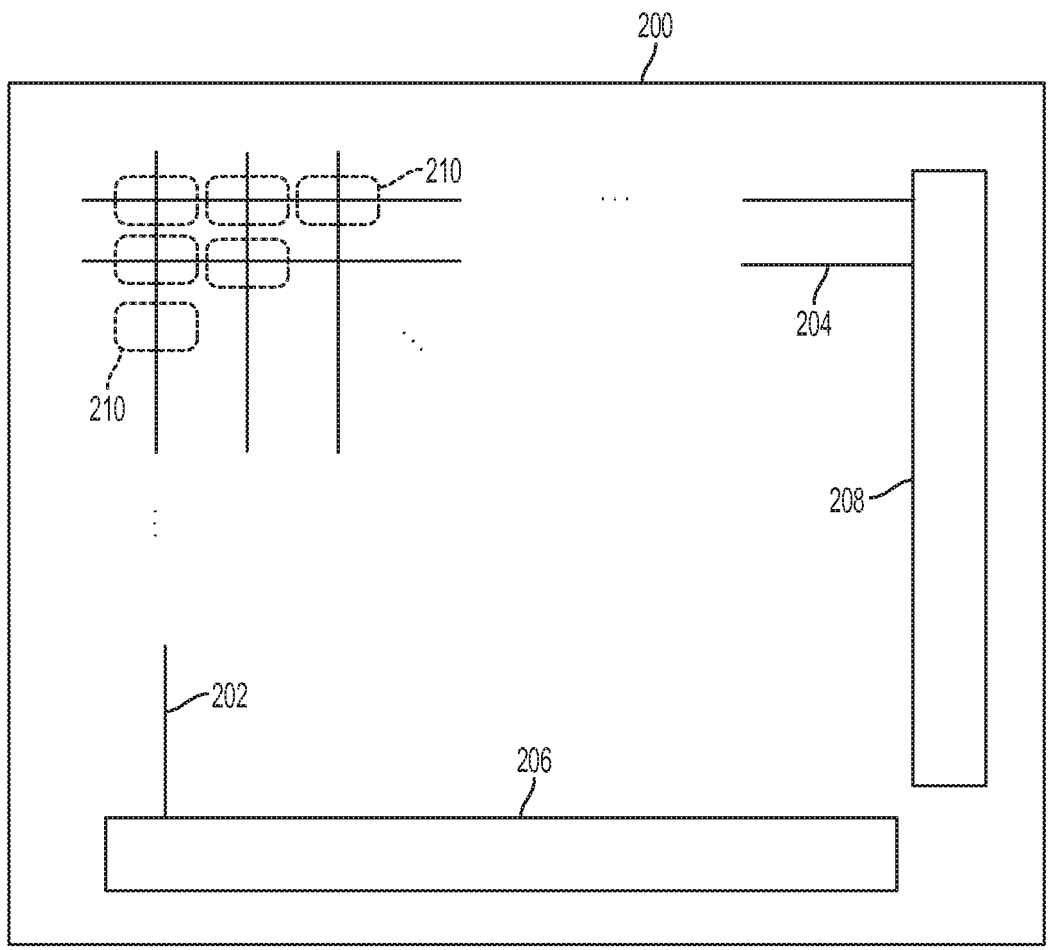
FIG. 2 illustrates a conceptual drawing of a capacitive sensing device.

FIG. 2 illustrates a conceptual drawing of capacitive sensing device. The capacitive sensing device 200 can include a set of drive lines 202 arranged in columns and a set of sense lines 204 arranged in rows. In other embodiments, the sense lines can be arranged in columns and the drive lines in rows. It should be noted that the term "lines" is used herein to mean simply conductive pathways, as one skilled in the art will recognize the pathways are not limited to elements that are strictly linear, but can include pathways that change direction and can include pathways of different sizes, shapes, and materials.

The drive lines 202 can be charged by drive signals output from one or more drive circuits (not shown) and received by one or more drive interfaces 206 in the capacitive sensing device 200. By way of example only, the drive circuit(s) or the drive interface(s) 206 can included a timed circuit that selects each drive line 202 in turn and drives that line for a relatively short period of time, eventually selecting each drive line 202 in a round-robin fashion.

Similarly, sense signals received on the sense lines 204 can be output by one or more sense interfaces 208 in the capacitive sensing device 200 and transmitted to one or more sense circuits (not shown). By way of example only, the sense circuit(s) or the sense interface(s) 208 can included a timed circuit that selects each sense line 204 in turn and senses that row for a relatively short period of time, eventually selecting each sense line 204 in a round-robin fashion.

The drive lines 202 and the sense lines 204 are configured to produce individual capacitive sensors 210. The individual capacitive sensors 210 can be dispersed such that each capacitive sensor 210 can represents a different position on the touch device.

Figure 3A:
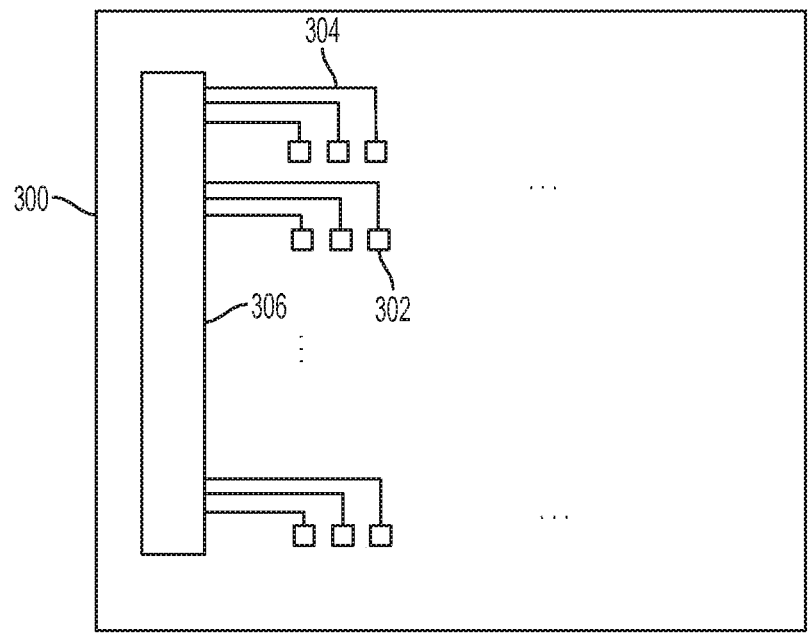
FIGS. 3A-3B depict conceptual drawings of an array of pixels that include capacitive sensors.
Figure 3B:
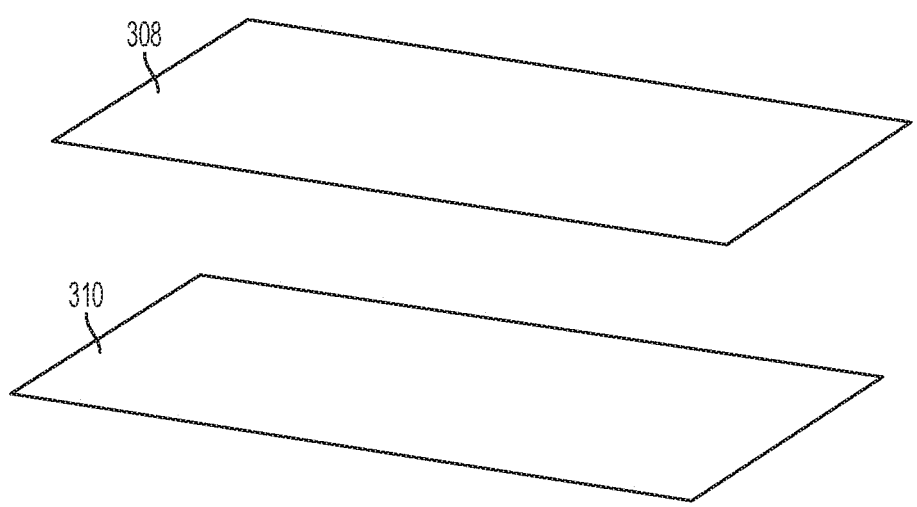

In another embodiment, each capacitive sensor is included in an individual pixel of a display layer, thereby combining the display and capacitive sensing functions in each pixel. FIGS. 3A-3B depict conceptual drawings of an array of pixels that include capacitive sensors. In the illustrated embodiment, the individual pixels are included on a display layer 300 and each pixel combines the display and capacitive sensing functions. For simplicity, only the capacitive sensing function is described herein.

A conductive layer 308 is patterned into discrete electrodes 302 with each electrode connected to a sense line 304. Each discrete electrode 302 is included in a pixel. The sense lines 304 can be connected to sense circuits (not shown) through a sense interface 306. The conductive layer 308 with the discrete electrodes 302 can be disposed over a common node layer 310. The combination of an individual electrode 302 and the common node 310 forms a capacitive sensor. In another embodiment, the conductive layer 308 can be disposed under the common node 310. Typically, an insulating layer is disposed between the conductive layer 308 and the common node layer 310.

The common node 310 can be driven with an excitation signal when the capacitive sensors in the array of pixels operate in a mutual capacitance mode. The sense lines 304 are scanned to measure the capacitance between the electrodes 302 in each pixel and the common node 310.

The common node 310 can be connected to a reference voltage or signal, such as ground, when the capacitive sensors in the array of pixels operate in a self-capacitance mode. In a self-capacitance system, the capacitance of a single electrode with respect to ground can be measured. A sense line 304 can be used to measure the capacitance between an electrode 302 and the common node 310 (e.g., ground).

Additionally or alternatively, embodiments can include force sensing systems that detect an amount of force applied to a touch device, or changes in amounts of force applied to the touch device, by measuring capacitive changes at one or more capacitive sensors. The touch device can be a touchscreen, a track pad, or other input device. A force detecting system can include a flexible touchable surface that is included in a device or display stack. The device or display stack can further include a compressible gap and a capacitive sensing device capable of detecting changes in capacitance in response to surface flex, such as flex caused by an applied force. The compressible gap can include an air gap, a compressible substance, or a compressible structure.

By way of example only, two patterned conductive layers can both be active layers and operate in a mutual capacitance force-sensing mode. As the device or display stack is pushed or otherwise moved downward, the capacitance of individual pixel capacitive sensors or row/column intersection may increase, since the layers are moved closer to one another. This increase in capacitance may be correlated to a decrease in distance between the layers, and thus, to an amount of force needed to move the layers a given distance.

Alternately, one patterned conductive layer can be active while the other conductive layer is passive, thereby operating in a self-capacitance force-sensing mode. As the active layer moves toward the self-capacitive sense layer, the capacitance measured at any individual pixel capacitive sensor or row/column intersection may change. Again, this change in capacitance may be correlated to a change in distance between the conductive layers and, thus, to an amount of force required to move the layers that distance.

Figure 4:
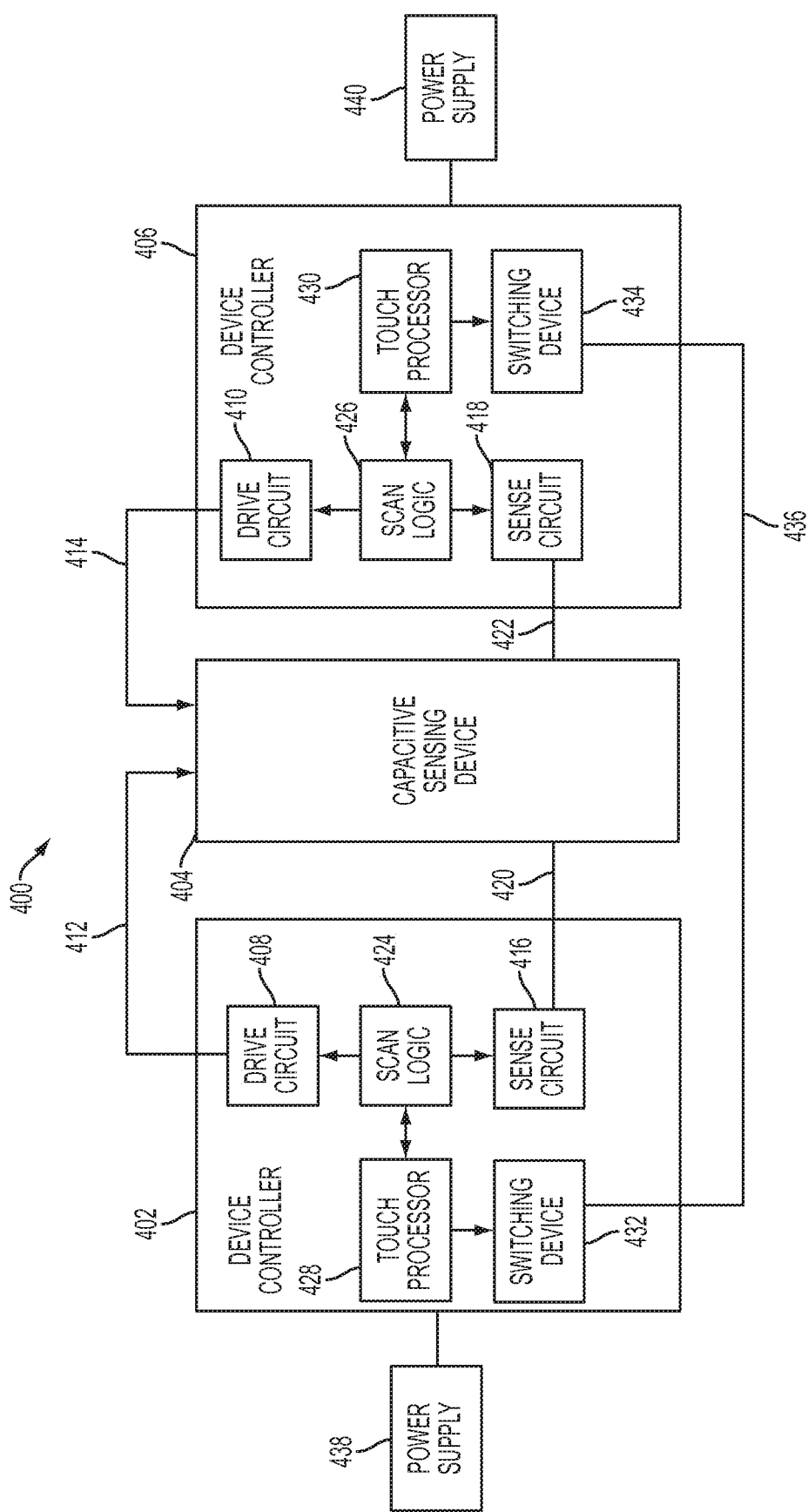
FIG. 4 illustrates a simplified block diagram of one example of a capacitive sensing system.

Referring now to FIG. 4, there is shown a simplified block diagram of one example of a capacitive sensing system. The capacitive sensing system 400 includes a first device controller 402, a capacitive sensing device 404, and a second device controller 406. The first and second device controllers 402, 406 can be implemented with any type of suitable controller, including, but not limited to, an application specific integrated circuit (ASIC).

In one embodiment, the first device controller 402 can be used to control a portion of the capacitive sensors in the capacitive sensing device 404 and the second device controller 406 can control another portion of the capacitive sensors. In another embodiment, only one device controller can be used to control the capacitive sensors in the capacitive sensing device 404. The number of device controllers that is used to control the capacitive sensing device 404 can be based on a one or more system aspects, including, but not limited to, the number of capacitive sensors in the capacitive sensing device 404 and/or the configuration of the capacitive sensing device. Additionally, when multiple controllers are used to control a capacitive sensing device, the portions of the capacitive sensing device that each controller controls can be equal or can vary. By way of example only, each controller can control half of the capacitive sensors in a capacitive sensing device.

The first and second device controllers 402, 406 can each include a drive circuit 408, 410 that provides a drive signal on a respective signal line 412, 414. As described earlier, the drive signal can be selectively applied to the drive lines (e.g., 202 in FIG. 2) in the capacitive sensing device 404. The signal lines 412, 414 can be implemented as conductive traces or with other conductive routing technologies such as those associated with printed circuit boards, flexible circuits, and integrated circuits.

The first and second device controllers 402, 406 can each further include a sense circuit 416, 418 that receives sensed signals on a respective signal line 420, 422. As described earlier, the sensed signals can be selectively transmitted from the sense lines (e.g., 204 in FIG. 2) to a sense circuit 416, 418. The signal lines 420, 422 can be implemented as conductive traces or with other conductive routing technologies such as those associated with printed circuit boards, flexible circuits, and integrated circuits.

Scan logic 424, 426 can be connected to the sense circuits 416, 418 and can provide control for respective sense circuits 416, 418 to selectively scan the sense lines in the capacitive sensing device 404. The scan logic 424, 426 can be connected to respective drive circuits 408, 410 and can control the drive circuits 408, 410 to generate drive signals at various frequencies and phases that can be selectively applied to the drive lines in the capacitive sensing device 404.

Each device controller 402, 406 can further include a touch processor 428, 430, such as, for example, a microprocessor. A touch processor 428, 430 can be connected to a respective scan logic 424, 426 and can control the scan logic 424, 426 and can process the sensed signals. The touch processor 428, 430 can be used to detect an amount of force applied to a touch device, or changes in amounts of force applied to the touch device in one embodiment. In another embodiment, a host processor (not shown) can be in communication with the touch processors 428, 430 and the host processor can be used to detect an amount of force, or changes in amounts of force, applied to the touch device.

The device controllers 402, 406 can each include a switching device 432, 434 that can be connected to a respective touch processor 428, 430 and to a common node 436. The common node 436 can be made of any suitable conductive material or combination of conductive materials, including, but not limited to, a metal. By way of example only, the common node 436 can be a shield that is configured to protect the capacitive sensing device 404 and to reduce errors in capacitance measurements, which can be caused in part by stray or parasitic capacitances.

The touch processors 428, 430 can be used to control the switching devices 432, 434 to selectively apply a signal to the common node 436 and to selectively discharge the signal from the common node 436. The switching devices 432, 434 will be discussed in more detail with respect to FIG. 5.

A power supply 438, 440 is connected to each device controller 402, 406. The power supplies 438, 440 can be implemented as a single shared power supply or as two separate power supplies. The power supplies 438, 440 can be any suitable type of power supply, including, but not limited to a voltage source.

Figure 5:
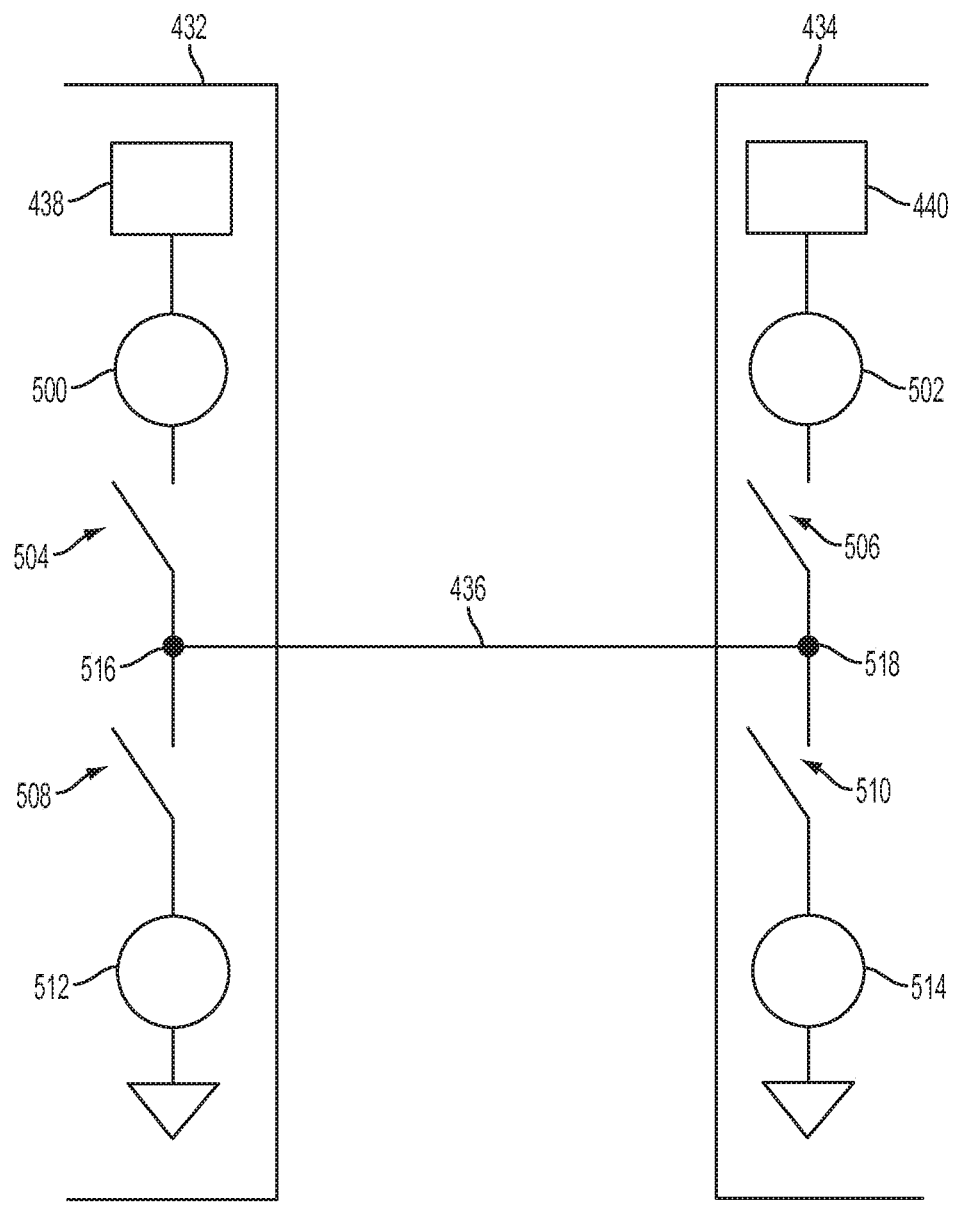
FIG. 5 depicts a simplified schematic view of one example of the switching devices 432, 434 shown in FIG. 4.

FIG. 5 illustrates a simplified schematic view of one example of the switching devices 432, 434 shown in FIG. 4. Switching devices 432, 434 can each include a first current source 500, 502 connected to a respective power supply 438, 440. The first current sources 500, 502 can each be connected in series to a respective first switch 504, 506. The first switches 504, 506 can each be connected in series to a respective second switch 508, 510. And the second switches 508, 510 can each be connected in series to a respective second current source 512, 514. The second current sources 512, 514 can each be connected to ground. In other embodiments, a voltage source connected to a switch having non-overlapping switch openings and closings, or a voltage source connected to a comparative switch, can be used in place of one or more current sources 500, 502, 512, 514.

The common node 436 is connected between switch nodes 516, 518. In one embodiment of a row and column self-capacitance sensing system, a scanning operation includes selecting a drive line (e.g., 202 in FIG. 2) using the scan logic and a respective drive circuit, and the drive line charged or driven to a given voltage or current level. To reduce stray capacitances, the common node 436 is driven to the given voltage or current level using the switching devices 432, 434. The sense lines are then scanned and the capacitances are measured and compared to a reference capacitance to determine if any changes in capacitance have occurred. For example, a capacitance change can occur when a finger or conductive stylus applies one or more forces to the touch device.

The charge on the selected drive line and on the common node 436 is then discharged. The selected drive line and the common node can be discharged by connecting the selected drive line and the common node to a reference level, such as ground. The selected drive line is discharged using the scan logic and respective drive circuit while the common node 436 is discharged using the switching devices 432, 434. The scanning process is repeated for each drive line. Thus, the capacitance of each capacitive sensor is measured by selectively charging each drive line and the common node, measuring the capacitance by sensing the sense lines, and then discharging the selected drive line and the common node 436.

With the capacitance sensing system shown in FIG. 4, the device controllers 402, 406 can individually charge and discharge some of the capacitive sensors in the charge sensing device 404, and can control the charging and discharging of the common node 436. Each charging and discharging cycle of the signal lines 412, 414 and the common node 436 can be coordinated to reduce or eliminate cross-coupling noise that may be generated when the charging and/or discharging events occur out of phase. For example, if all of the drive lines and the common node are to be charged and discharged, the charging and discharging events can be synchronized so that the integration period for the capacitive sensors is opened and closed at the same, or substantially the same, time. Additionally or alternatively, the charging and discharging events can be synchronized so that the components and associated charge and discharge levels have time to settle in case the charging and/or discharging events occur at different speeds.

In an embodiment of a per-pixel self-capacitance sensing device, the common node (e.g., 310 in FIG. 3B) is driven with an excitation or drive signal and the sense lines (e.g., 304 in FIG. 3A) are scanned to measure the capacitance of each pixel capacitive sensor. When multiple controllers are used to control a scanning operation, the device controllers can control the charging and discharging of the common node 436 using the switching devices 432, 434.

Figure 6:
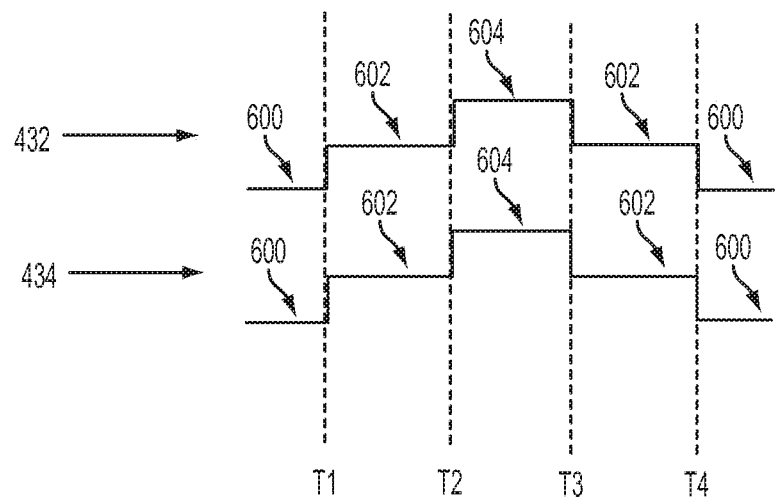
FIG. 6 illustrates one example of a timing diagram for the switching devices 432, 434 shown in FIG. 4.

Referring now to FIG. 6, there is shown one example of a timing diagram for the switching devices 432, 434 shown in FIG. 5. The illustrated timing diagram can be used for a capacitive sensing device that operates in a mutual capacitance mode and includes the capacitive sensors in each pixel in a pixel array, Prior to time T1, both switching devices 432, 434 connect the common node 436 to a reference level 600, such as ground. When a scanning operation is to begin, the current sources 500, 502 can be placed in an intermediate or tri-state phase 602 by placing the switches 504, 506, 508, 510 in an open state. An intermediate or tri-state phase is a phase where no active drive signal is output from the current sources.

At time T2, the current sources 500, 502 can be placed in an on phase to charge the common node 436 by closing the switches 504, 506 (switches 508, 510 remain open). When the charging event is complete at time T3, the current sources 500, 502 can be returned to the tri-state phase 602 by opening the switches 504, 506 (switches 508, 510 remain open). At time T4, the current sources 500, 502 can be placed in an off phase and the switches 508, 510 can be placed in a closed state (switches 504, 506 remain open).

The tri-state phases can prevent the on and off states of the current sources from overlapping. For example, the on and off states of the current sources can be a little out of phase with respect to each other. The tri-state phase provides additional time for the two current sources to be in the on or off states concurrently.

Figure 7:
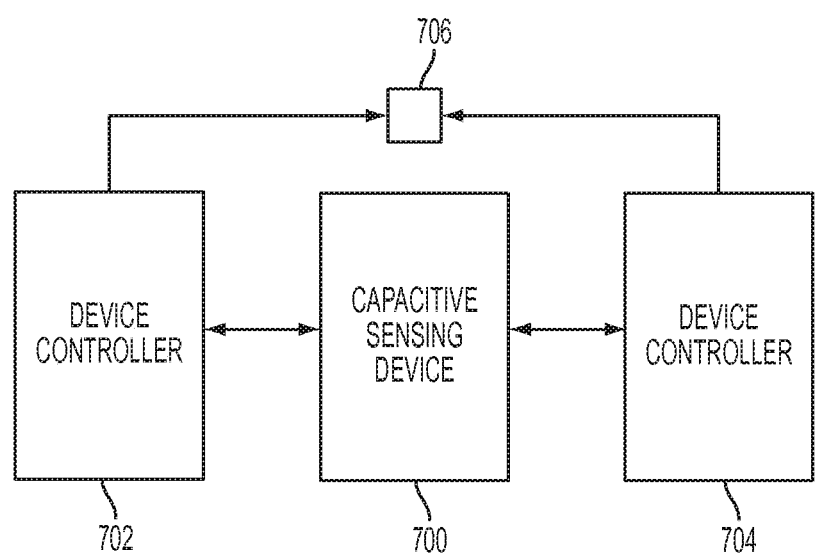
FIG. 7 depicts a simplified conceptual drawing of a shared capacitive sensor in a capacitive sensing system.

When a capacitive sensing system determines whether a force or forces has been applied to a touch device, the measured capacitances are typically compared to a reference or absolute capacitance to determine if a capacitance change has occurred at one or more capacitive sensors. The reference capacitance can be shared by the multiple device controllers in some embodiments. FIG. 7 depicts a simplified conceptual drawing of a shared capacitive sensor in a capacitive sensing system. A capacitive sensing device 700 is connected to device controllers 702, 704. Each device controller 702, 704 can control only a portion of the capacitive sensors in the capacitive sensing device 700 in one embodiment.

Reference capacitance sensor 706 can be measured by both device controllers 702, 704. The reference capacitance sensor 706 can be a separate and discrete capacitive sensor, or the reference capacitance sensor 706 can be included in the capacitive sensing device 700. Although only one reference capacitance sensor is shown, a capacitive sensing system can include one or more reference capacitance sensors.

Figure 8:
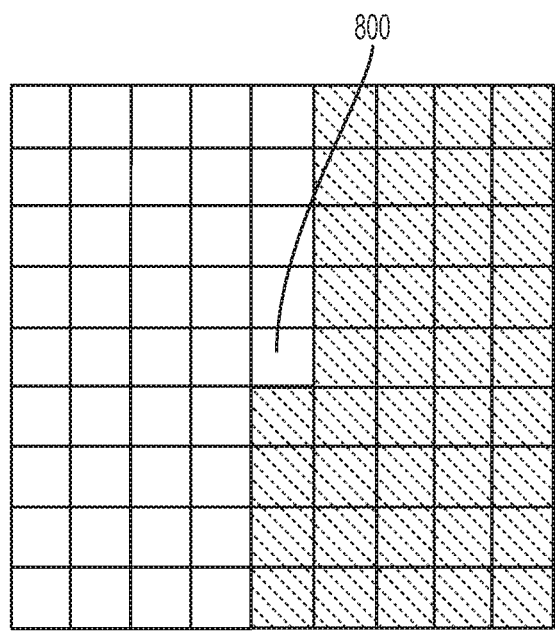
FIG. 8 illustrates one example of a layout for a capacitive sensing device having a shared capacitive sensor.

Referring now to FIG. 8, there is shown one example of a layout for a capacitive sensing device having a shared capacitive sensor and multiple device controllers. The shared capacitive sensor 800 can be the capacitive sensor positioned in the center of the capacitive sensing device. Additionally, each device controller may control only a portion of the capacitive sensors in the capacitive sensing device. In the illustrated embodiment, one device controller may control the capacitive sensors free of hatch lines while the other device controller controls the capacitive sensors that include the hatch lines. Control of the capacitive sensing device is roughly divided in half in the illustrated embodiment, with one device controller controlling one half of the capacitive sensors and the other device controller controlling the other half of capacitive sensors.

Figure 9:
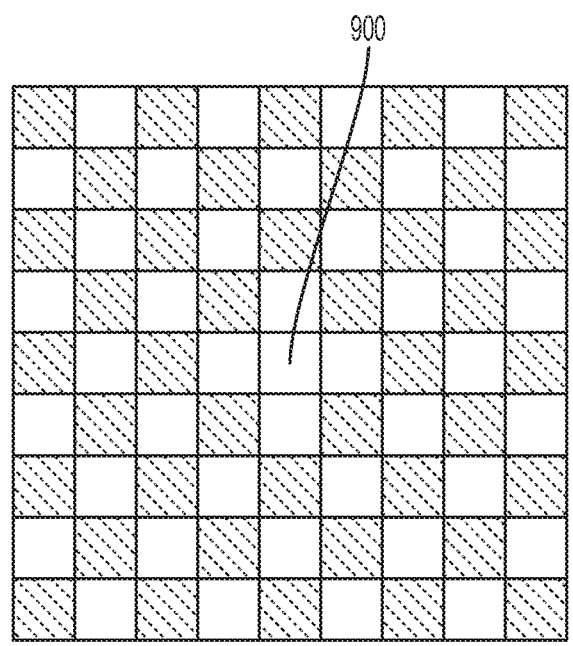
FIG. 9 depicts another layout for a capacitive sensing device having a shared capacitive sensor and multiple device controllers.

FIG. 9 illustrates another layout for a capacitive sensing device having a shared capacitive sensor and multiple device controllers. The shared capacitive sensor 900 can be the capacitive sensor positioned in the center of the capacitive sensing device. In the illustrated embodiment, one device controller may control the capacitive sensors not including hatch lines while the other device controller controls the capacitive sensors that include the hatch lines. Control of the capacitive sensors in the capacitive sensing device is configured in a checkerboard pattern. In some embodiments, an artifact may be more easily diagnosed with this configuration. The artifact can be produced, for example, by a defect or break in the capacitive sensing system or in the electronic device. Alternatively, it may be easier to compensate for a discrepancy in one device controller compared to the other device controller because the artifact can be uniform across the capacitive sensing device instead of occurring at a seam in the capacitive sensing device where the control shifts from one device controller to the other.

Other embodiments can include any number of shared capacitive sensors. For example, an entire row of column of capacitive sensors can be shared. Alternatively, multiple shared capacitive sensors can be distributed throughout a capacitive sensing device.

Figure 10:
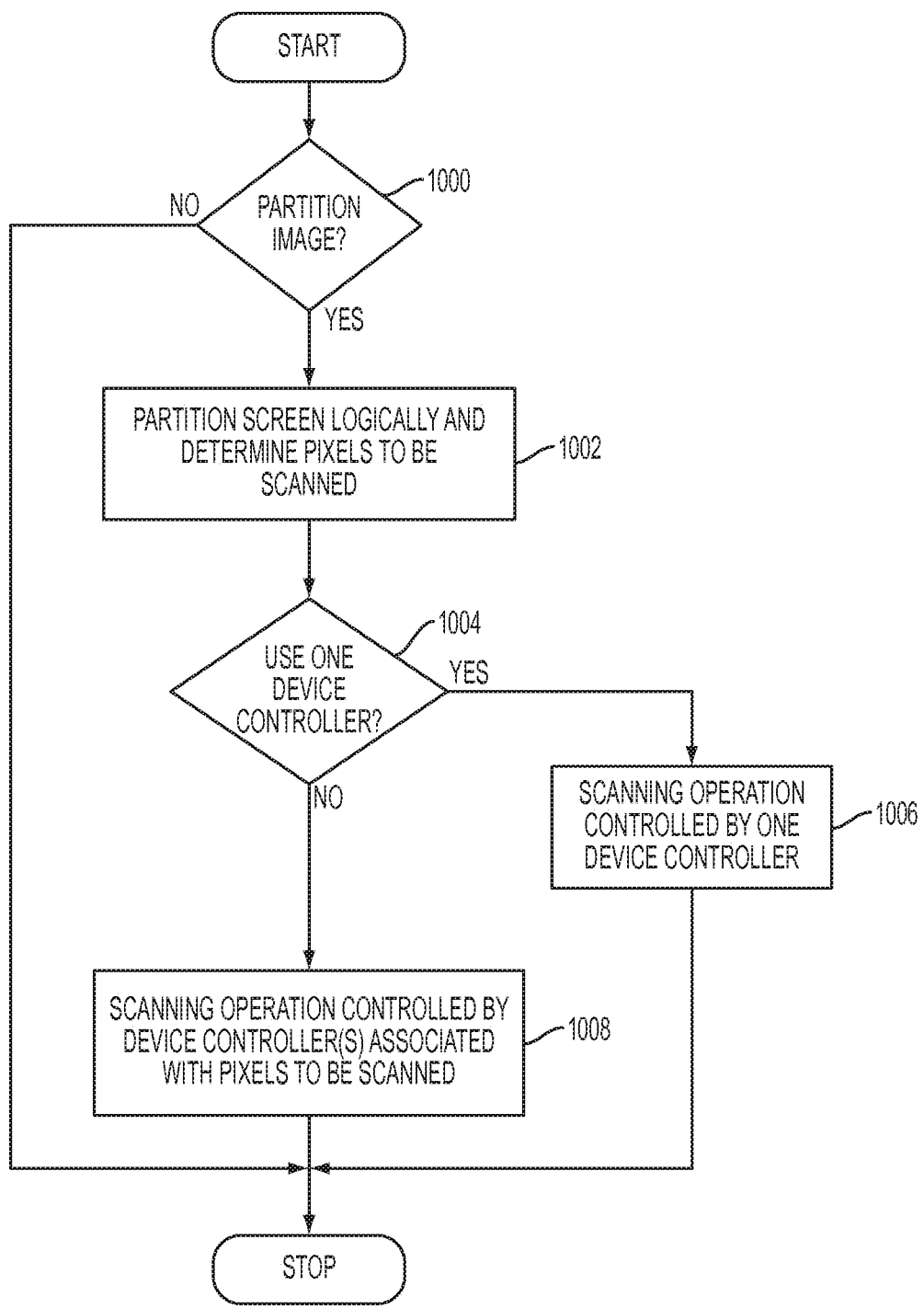
FIG. 10 is a flowchart of one embodiment of a method for operating a multiple device controller capacitive sensing system.

Referring now to FIG. 10, there is shown a flowchart of one embodiment of a method for operating a multiple device controller capacitive sensing system. Initially, a determination is made at block 1000 as to whether a surface of a touch device is to be partitioned logically into two or more sections. For example, as described earlier, a number of folders can be displayed on a touch screen and an applied force can be used to interact with only one of the folders. In another example, a program, such as a video game, can use one or more sections of the touchscreen for controlling or interacting with the video game through one or more applied forces.

If the surface of the touch device is to be partitioned, the method continues at block 1002 where the surface is partitioned into sections and the capacitive sensors included in at least one section that is to be used to detect an applied force are identified. A determination is then made at block 1004 as to whether one device controller is to be used to control the scanning operation. The number of device controllers that are used to control the scanning operation can be determined by which capacitive sensors are to be scanned during the scanning operation. The capacitive sensors in the at least one section to be scanned can be operatively connected to only one device controller (e.g. either the first device controller or the second device controller), or some of the capacitive sensors can be connected to the first device controller and the other capacitive sensors can be connected to the second device controller. So if all of the capacitive sensors in the at least one section to be scanned are connected to only the first device controller or to only the second device controller, then the respective device controller is used to control the scanning operation (block 1006). The charging and discharging events that occur during the scanning operation are controlled by the respective device controller.

However, if some of the capacitive sensors in the at least one section to be scanned are operatively connected to the first device controller and the other capacitive sensors to be scanned are operatively connected to the second device controller, then both the first and second device controllers are used to control the scanning operation (block 1008). The charging and discharging events that occur during the scanning operation can be controlled and synchronized by both the first and second device controllers.

Various embodiments have been described in detail with particular reference to certain features thereof, but it will be understood that variations and modifications can be effected within the spirit and scope of the disclosure. For example, embodiments can use more than two device controllers to control a capacitive sensing device. As another example, the embodiments described herein have described the two device controllers independently controlling a capacitive sensing device. The multiple device controllers are the same with respect to each other. Other embodiments are not limited to this construction. For example, the multiple device controllers can be configured in a master-slave arrangement. Differentiating logic would be included in such an arrangement that instructs one device controller to be the master and the other device controller to be a slave. In the master-slave arrangement, one device controller is different from the other device controller.

Additionally, the embodiments described herein have been described as detecting one or more applied forces on a touch device. Other embodiments can use multiple device controllers to detect one or more touches on the touch device. With touch detection, the capacitance of one or more capacitive sensors changes when a finger (or fingers) or a conductive stylus touch the touch device.

And even though specific embodiments have been described herein, it should be noted that the application is not limited to these embodiments. In particular, any features described with respect to one embodiment may also be used in other embodiments, where compatible. Likewise, the features of the different embodiments may be exchanged, where compatible.

The invention claimed is:

1. An electronic device, comprising:
a force sensing device comprising capacitive sensors;
a first device controller that controls charging and discharging of a first group of the capacitive sensors; and
a second device controller that controls charging and discharging of a second group of the capacitive sensors that is different from the first group, the second device controller inoperative to control at least a portion of the first group of the capacitive sensors.

2. The electronic device of claim 1, wherein the first device controller controls charging and discharging of the first group of the capacitive sensors while the second device controller controls charging and discharging of the second group of the capacitive sensors.

3. The electronic device of claim 1, further comprising a common node.

4. The electronic device of claim 3, wherein:
the first device controller is connected to the common node by a first switching device; and
the second device controller is connected to the common node by a second switching device.

5. The electronic device of claim 3, wherein the first device controller and the second device controller can both control charging and discharging of the common node.

6. The electronic device of claim 1, wherein:
the first device controller is connected to the first group of the capacitive sensors by a first signal line; and
the second device controller is connected to the second group of the capacitive sensors by a second signal line.

7. The electronic device of claim 1, wherein the second device controller is able to control only a portion of the capacitive sensors.

8. A force sensing device, comprising;
capacitive sensors;
a first device controller; and
a second device controller that controls charging and discharging of a different group of the capacitive sensors than the first device controller, the first device controller inoperative to control charging and discharging of at least a portion of the different group of the capacitive sensors.

9. The force sensing device of claim 8, wherein the first device controller and the second device controller are operable to simultaneously control respective groups of the capacitive sensors.

10. The force sensing device of claim 8, wherein the first device controller and the second device controller are both operable to control a shared group of the capacitive sensors.

11. The force sensing device of claim 8, wherein the first device controller synchronizes control of respective groups of the capacitive sensors with the second device controller.

12. The force sensing device of claim 8, wherein the first device controller is operable to control more capacitive sensors than the second device controller.

13. The force sensing device of claim 8, wherein a number of the capacitive sensors controlled by the first device controller varies.

14. The force sensing device of claim 8, further comprising an array of pixels wherein each of the array of pixels is associated with one of the capacitive sensors.

15. An input device, comprising:
a touch surface;
capacitive sensors coupled to the touch surface;
a first device controller connected to a first set of the capacitive sensors; and
a second device controller connected to a second set of the capacitive sensors different from the first set; wherein:
the second device controller controls charging and discharging of the second set of the capacitive sensors;
the second device controller is inoperative to control charging and discharging of the first set of the capacitive sensors; and
an amount of a force applied to the touch surface is determinable using at least a capacitance change detected by the first set of the capacitive sensors or the second set of the capacitive sensors.

16. The input device of claim 15, wherein the first set of the capacitive sensors is contiguous.

17. The input device of claim 15, wherein the first set of the capacitive sensors is interleaved with the second set of the capacitive sensors.

18. The input device of claim 15, wherein:
the first device controller is connected to the first set of the capacitive sensors by a first drive line and a first sense line; and
the second device controller is connected to the second set of the capacitive sensors by a second drive line and a second sense line.

19. The input device of claim 15, wherein the input device comprises a trackpad.

20. The input device of claim 15, wherein the capacitive sensors are pixels of a display that combine display functions and capacitive sensing functions.

* * * * *